(12) United States Patent
Xu (10) Patent No.: US 8,762,121 B2
(45) Date of Patent: Jun. 24, 2014

(54) OPTIMIZATION-BASED SIMULATED ANNEALING FOR INTEGRATED CIRCUIT PLACEMENT

(75) Inventor: Huaiyu Xu, Liaoning (CN)

(73) Assignee: Northeastern University Technology Transfer Center (CN)

( * ) Notice: Subject to any disclaimer, the term of this patent is extended or adjusted under 35 U.S.C. 154(b) by 179 days.

(21) Appl. No.: 13/256,635

(22) PCT Filed: May 25, 2010

(86) PCT No.: PCT/CN2010/073206
§ 371 (c)(1),
(2), (4) Date: Sep. 15, 2011

(87) PCT Pub. No.: WO2011/147075
PCT Pub. Date: Dec. 1, 2011

(65) Prior Publication Data
US 2012/0136633 A1 May 31, 2012

(51) Int. Cl.
*G06F 17/50* (2006.01)
(52) U.S. Cl.
USPC ............................................................ 703/13
(58) Field of Classification Search
USPC ............................................ 716/124; 703/13
See application file for complete search history.

(56) References Cited

U.S. PATENT DOCUMENTS

| | | | |
|---|---|---|---|
| 5,640,327 A * | 6/1997 | Ting | 716/121 |
| 5,822,214 A * | 10/1998 | Rostoker et al. | 716/123 |
| 6,185,724 B1 | 2/2001 | Ochotta | |
| 6,651,233 B2 * | 11/2003 | Teig et al. | 716/123 |
| 7,100,137 B2 * | 8/2006 | Teig et al. | 716/123 |
| 7,543,251 B2 * | 6/2009 | Teig et al. | 716/132 |
| 7,984,410 B2 * | 7/2011 | Chen et al. | 716/119 |
| 2009/0254874 A1 * | 10/2009 | Bose | 716/6 |
| 2012/0297354 A1 * | 11/2012 | Scheffer | 716/122 |

FOREIGN PATENT DOCUMENTS

CN 101187957 A 5/2008

OTHER PUBLICATIONS

Yao-Wen Chang et al., "Physical design for system-on-a-chip," 2006, in "Essential Issues in SOC Design," Springer, pp. 311-403.*
E. Triki et al., "A theoretical study on the behavior of simulated annealing leading to a new cooling schedule," 2005, European Journal of Operational Research, vol. 166, issue 1, pp. 77-92.*

(Continued)

*Primary Examiner* — Kamini S Shah
*Assistant Examiner* — Russ Guill
(74) *Attorney, Agent, or Firm* — Ren-Sheng International (57) ABSTRACT

Generating of the initial temperature value for a simulated annealing process in the placement of circuit components in the physical design of integrated circuit (IC) is based on previous partitioning, if any, of the IC components into bins. An iteration limit value is then assigned equal to the initial temperature value. The simulated annealing process is then performed on a current partitioning of the IC components into bins according to the iteration limit value. The IC components are partitioned further into an exponentially larger total number of smaller bins compared to a previous number of bins. The process is then repeated starting with the operation of generating an initial temperature value for the simulated annealing process until the number of circuit components in each bin is below a specified number.

16 Claims, 9 Drawing Sheets

(56) References Cited

OTHER PUBLICATIONS

Yaska Sankar et al., "Trading quality for compile time: ultra-fast placement for FPGAs," 1999, Proceedings of the 1999 ACM/SIGDA seventh international symposium on Field programmable gate arrays, pp. 157-166.*

James M. Varanelli et al., "A fast method for generalized starting temperature determination in homogeneous two-stage simulated annealing systems," 1999, Computers & Operations Research, vol. 26, pp. 481-503.*

Notification of Transmittal of the International Search Report and the Written Opinion of the International Searching Authority, Mar. 10, 2011.

George Karypis et al., "Multilevel K-Way Hypergraph Partitioning," VLSI Design, 2000, pp. 1-16, vol. 00, No. 00, Overseas Publishers Association, Malaysia.

Huaiyu Xu et al., "A Trade-Off Oriented Placement Tool," Proc. IEEE/ACM International Conference on Computer-Aided Design, 2003, pp. 467-471, San Jose, CA.

Maogang Wang, "Dragon2000: Standard-Cell Placement Tool for Large Industry Circuits," IEEE/ACM International Conference on Computer-Aided Design, 2000, pp. 260-263, San Jose, CA.

Hajime Kubota et al., "A Hierarchical Standard-Cell Placement Method Based on Wire Length-Driven Clustering", Technical Report of IEICE, the Institute of Electronic, Information and Communication Engineers, Nov. 21, 2003, vol. 103, No. 480, pp. 169-174.

Hajime Kubota et al., "A Hierarchical Standard-Cell Placement Method Based on Wire Length-Driven Clustering", IEIC Technical Report (Institute of Electronic, Information and Communication Engineers), Nov. 21, 2003, vol. 103, No. 480.

Huaiyu Xu et al., "A Trade-off Oriented Placement Tool", ICCAD'03, Nov. 11-13, 2003, pp. 467-471, San Jose, California, USA.

* cited by examiner

OPTIMIZATION-BASED SIMULATED ANNEALING FOR INTEGRATED CIRCUIT PLACEMENT

CROSS-REFERENCE TO RELATED APPLICATIONS

The present application is a 371 application of International Application PCT/CN2010/073206, filed on May 25, 2010 and entitled "OPTIMIZATION-BASED SIMULATED ANNEALING FOR INTEGRATED CIRCUIT PLACEMENT." The International Application, including any appendices or attachments thereof, is incorporated by reference herein in its entirety.

BACKGROUND

Physical design is one of the steps of the IC (integrated circuit) or VLSI (very large scale integrated circuit) design process. A microelectronic IC chip is a collection of cells with electrical interconnections between them. These cells may be formed on a semiconductor substrate (for example, silicon). A cell (also interchangeably referred to herein as a sub-circuit, circuit component, or module) is one or more circuit elements grouped to perform a function. Each cell can also include further cells, sub-circuits, components or modules.

The physical design of the IC may include three tasks: portioning, placement and routing. Among these tasks, placement is an essential operation and is the portion of the physical design flow that assigns exact locations for the various sub-circuits, cells, and/or circuit components within a chip's core area.

Various computer automated design (CAD) tools are available for determining optimal placement. These are often referred to as "placers". A common objective of a placer is to determine placement to minimize the "cost" of the chip design. For example, minimizing the total wire length (WL), or the sum of the length of all the wires in the design, is the primary objective of most existing placers. This not only helps minimize chip size, and hence cost, but also minimizes power and delay, which are proportional to the wire length. Simulated Annealing (SA) is a popular technique which has been frequently applied to solve the VLSI placement problem.

Simulated annealing is a probabilistic, iterative improvement technique used to solve many combinatorial optimization problems. Its name originated from the annealing process of gradually cooling molten metal to produce high quality metal structures. When performing simulated annealing placement, an initial placement is improved by iterative swaps and moves of the various sub-circuits, circuit components or cells. These swaps and moves may be accepted if they improve the cost. However, as circuit sizes continue to grow this simulated annealing process increasingly results in expensive runtime costs in order to achieve better placement results.

SUMMARY

Techniques for optimization-based, simulated annealing for integrated circuit placement are provided. In some embodiments, a simulated annealing method for determining placement of integrated circuit (IC) components within a core area of the IC during physical design of the IC includes a computer processor partitioning a netlist of the IC into an increasingly larger number of bins such that a placement optimizing effort increases along with the partitioning.

In some embodiments, a system for simulated annealing in determining placement of integrated circuit (IC) components within a core area of the IC during physical design of the IC includes a computer processor and at least one memory unit operably coupled to the computer processor. The at least one memory unit has computer executable instructions thereon for implementing an initial temperature value generator that generates an initial temperature value for the simulated annealing resulting in a placement optimizing effort during the simulated annealing that increases as computerized partitioning of a netlist of the IC increases.

In some embodiments, a computer readable medium has thereon computer executable instruction for simulated annealing for determining placement of integrated circuit (IC) components within a core area of the IC during physical design of the IC. The computer executable instructions includes instructions for generating an initial temperature value for a simulated annealing process and partitioning the IC components into an exponentially larger total number of smaller bins compared to a previous number of bins in the simulated annealing process, where the generating of the initial temperature value and partitioning the IC components causes a placement optimizing effort to increase linearly as the partitioning of the IC components increases.

In some embodiments, a simulated annealing method for determining placement of integrated circuit (IC) components within a core area of the IC during physical design of the IC includes: generating an initial temperature value for a simulated annealing process; and partitioning the IC components into an exponentially larger total number of smaller bins compared to a previous number of bins in the simulated annealing process. The generating of the initial temperature value and partitioning the IC components causes a placement optimizing effort to increase linearly as the partitioning of the IC components increases.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, apparatus, computer programs and systems related to pyramid optimization-based simulated annealing for IC placement.

Figure 1:
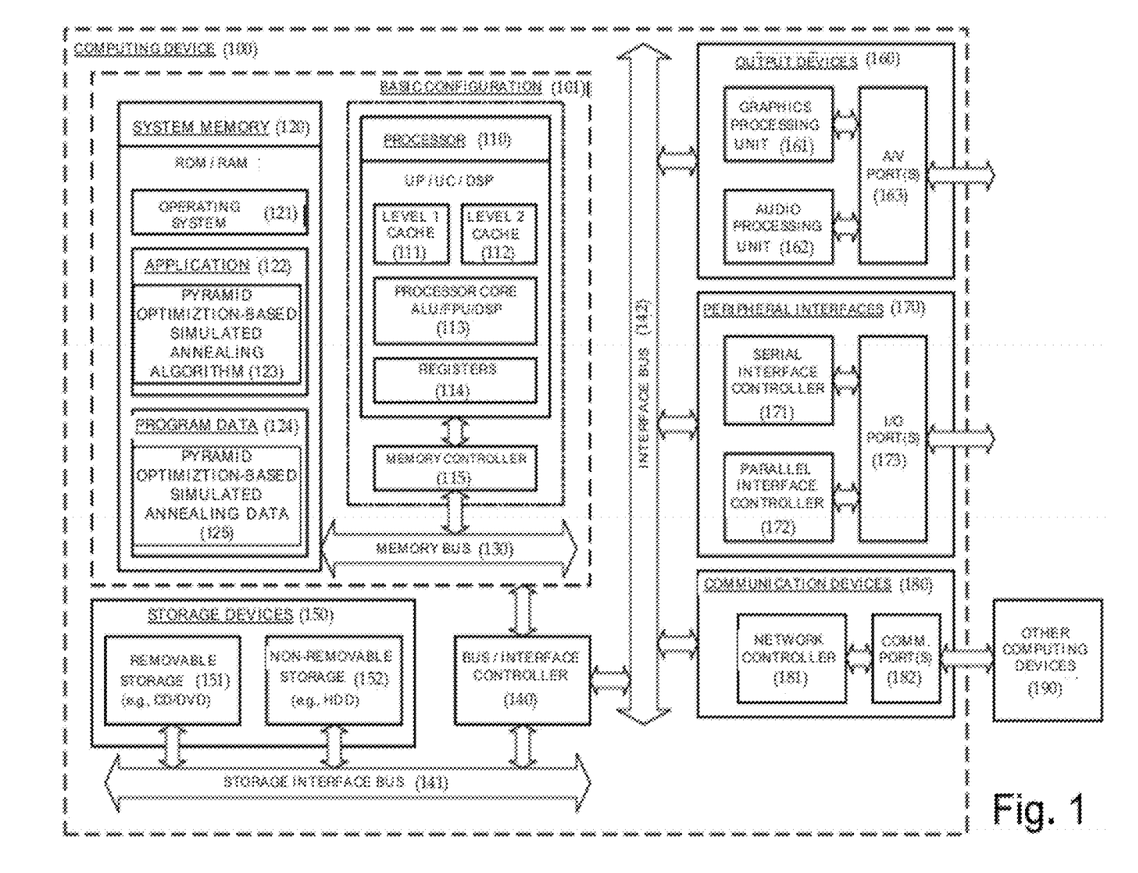
FIG. 1 a block diagram illustrating an example computing device that is arranged for implementing systems and methods for pyramid optimization-based simulated annealing for IC placement.

Referring to FIG. 1, shown is block diagram illustrating an example computing device that is arranged for implementing pyramid optimization-based simulated annealing for IC placement. In a very basic configuration, computing device 100 typically includes one or more processors 110 and system memory 120. A memory bus 130 can be used for communicating between the processor 110 and the system memory 120.

Depending on the desired configuration, processor 110 can be of any type including but not limited to a microprocessor (μP), a microcontroller (μC), a digital signal processor (DSP), or any combination thereof. Processor 110 can include one more levels of caching, such as a level one cache 111 and a level two cache 112, a processor core 113, and registers 114. The processor core 113 can include an arithmetic logic unit (ALU), a floating point unit (FPU), a digital signal processing core (DSP Core), or any combination thereof. A memory controller 115 can also be used with the processor 110, or in some implementations the memory controller 115 can be an internal part of the processor 110.

Depending on the desired configuration, the system memory 120 can be of any type including but not limited to volatile memory (such as RAM), non-volatile memory (such as ROM, flash memory, etc.) or any combination thereof. System memory 120 typically includes an operating system 121, one or more applications 122, and program data 124. Application 122 includes a pyramid optimization-based simulated annealing algorithm 123 that is arranged to perform pyramid optimization-based simulated annealing for IC placement. Program Data 124 includes pyramid optimization-based simulated annealing data 125 that is useful for performing pyramid optimization-based simulated annealing for IC placement, as will be further described below. In some embodiments, application 122 can be arranged to operate with program data 124 on an operating system 121 such that optimal placement of IC components may be determined during the physical design process of the IC. This described basic configuration is illustrated in FIG. 1 by those components within dashed line 101.

Computing device 100 can have additional features or functionality, and additional interfaces to facilitate communications between the basic configuration 101 and any required devices and interfaces. For example, a bus/interface controller 140 can be used to facilitate communications between the basic configuration 101 and one or more data storage devices 150 via a storage interface bus 141. The data storage devices 150 can be removable storage devices 151, non-removable storage devices 152, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 120, removable storage 151 and non-removable storage 152 are all examples of computer storage media. The term computer readable media as used herein includes computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 100. Any such computer storage media can be part of device 100.

Computing device 100 can also include an interface bus 142 for facilitating communication from various interface devices (e.g., output interfaces, peripheral interfaces, and communication interfaces) to the basic configuration 101 via the bus/interface controller 140. Example output devices 160 include a graphics processing unit 161 and an audio processing unit 162, which can be configured to communicate to various external devices such as a display or speakers via one or more A/V ports 163. Example peripheral interfaces 170 include a serial interface controller 171 or a parallel interface controller 172, which can be configured to communicate with external devices such as input devices (e.g., keyboard, mouse, pen, voice input device, touch input device, etc.) or other peripheral devices (e.g., printer, scanner, etc.) via one or more I/O ports 173.

An example communication interface device 180 includes a network controller 181, which can be arranged to facilitate communications with one or more other computing devices 190 over a network communication via one or more communication ports 182 and using any variety of communications media. The Communication connection is one example of a communication media. Communication media may typically include a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media.

Computing device 100 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 100 can also be implemented as a personal computer including both laptop computer and non-laptop computer configurations.

Figure 2:
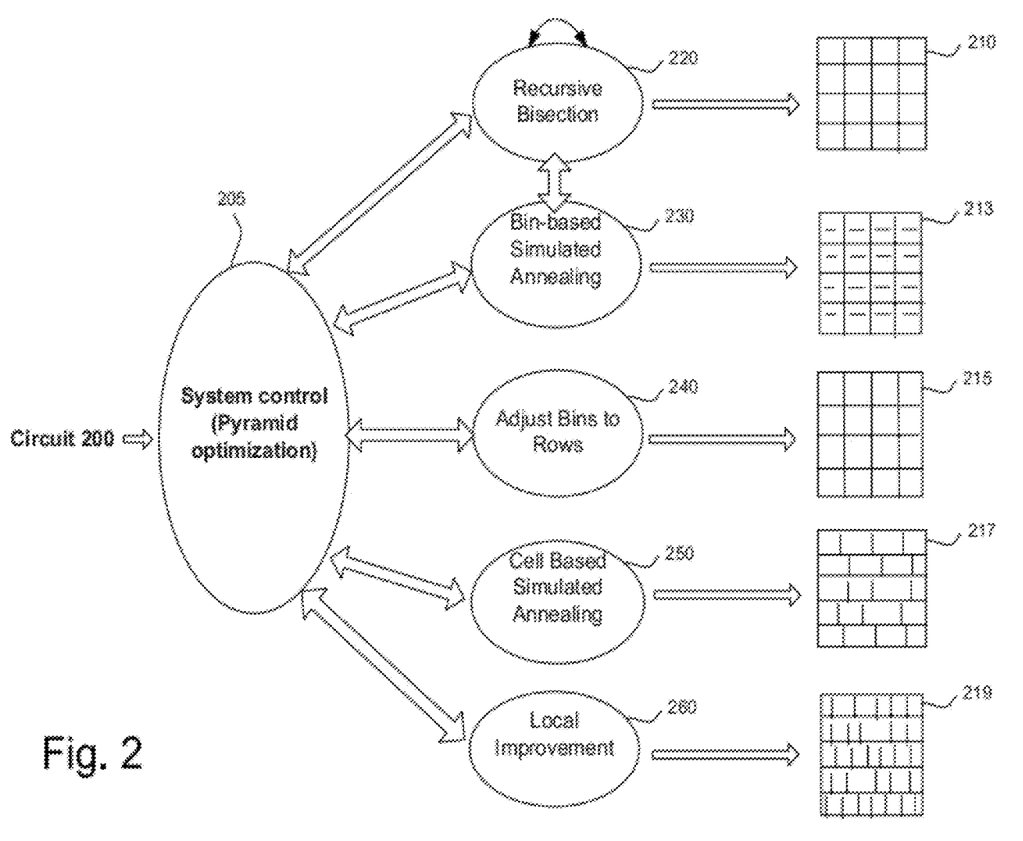
FIG. 2 is a diagram of an example system framework for pyramid optimization-based simulated annealing for IC placement.

Referring next to FIG. 2, shown is a diagram of an example system framework for pyramid optimization-based simulated annealing for IC placement. When performing simulated annealing placement, an initial placement is improved by iterative swaps and moves of the various circuit components or cells. These swaps and moves are accepted if they improve the cost of the circuit design.

Shown in FIG. 2 is a pyramid optimization system control 205 with an example input circuit 200. The pyramid optimization system control 205 uses a top-down hierarchical approach and starts the placement process by recursively bisecting 220 the circuit 200. At this operation, the given circuit 200 is recursively partitioned along alternatively horizontal and vertical cut lines 210 resulting in a number of specified rectangular areas of the IC (i.e., "bins"). The portions of the given circuit 200 within each bin are referred to as sub-circuits, circuit components, or cells herein and these terms may be used interchangeably. Each sub-circuit, circuit component, or cell may also include further cells, sub-circuits, components or modules.

After each partitioning in the recursive process, the sub-circuits are each assigned to a particular bin. A bin-based simulated annealing 230 process described in more detail below is then performed to improve the current sub-circuit placement 213. The moving objects in the bin-based simulated annealing 230 process are the sub-circuits in the bins. This procedure terminates when a predetermined stop criteria is satisfied. The predetermined stop criteria may be, for example, when the average number of cells per bin is less than a given number (e.g., 7).

An adjustment operation 220 is then executed to fit the current bin-based placement into row structures 215. The next operation is a cell-based simulated annealing 250. In cell-based simulated annealing, single cells within the sub-circuits are moved around the bins to further reduce placement cost (e.g., wirelength). After that, the final operation is local improvement 260, which spreads overlapped cells and makes local improvement to obtain the detailed placement 219.

Figure 3:
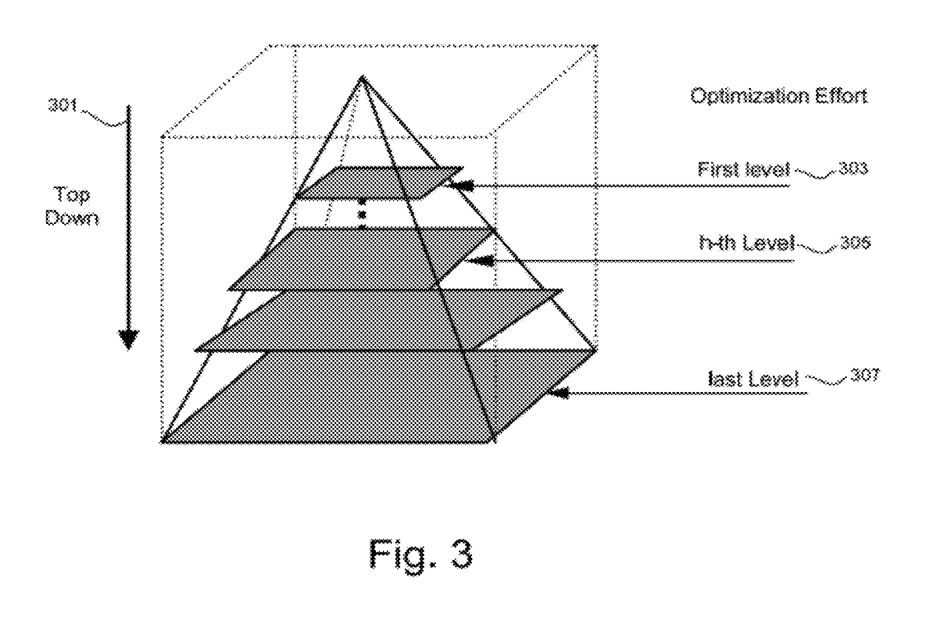
FIG. 3 is a diagram illustrating an example correlation between optimization level and optimization effort using a top-down hierarchical approach in the context of pyramid optimization-based simulated annealing for IC placement.

Referring next to FIG. 3, shown is a diagram illustrating an example correlation between optimization level and optimization effort using a top-down hierarchical approach in the context of pyramid optimization-based simulated annealing for IC placement. Pyramid optimization-based simulated annealing may be used in the context of a top-down hierarchical approach to placement as introduced above. At a given hierarchical level (e.g., the first level 303), the layout area is partitioned into several bins. The cells of the circuit are distributed into the several bins to minimize a certain placement objective in order to reduce cost. For example, the placement objective may be to minimize overall wire length of the final design. If a cell is distributed into a particular bin, it will be placed within the area of this bin in the final layout of the circuit. Proceeding to finer levels (e.g., the h-th level 305), the number of bins increases while the physical size of bins decreases. Thus, increasingly detailed information about the physical locations of cells on the layout can be obtained as each new level is reached. The top-down approach terminates at the last level 307 when there are only a few cells in each bin.

As an example, the pyramid optimization-based simulated annealing process for IC placement may first take as input what is referred to as a "netlist". As appreciated and commonly known by those of skill in the art, a netlist describes the connectivity of an electronic IC design. This may be, for example, a circuit description which includes a list of interconnected sub-blocks. The netlist may be written in variety of standard and proprietary netlist languages (e.g., Verilog™, VHDL™). In the present disclosure, an example netlist may be comprised of many circuit components, such as standard cells, macro blocks or I/O pads.

Starting from the first level 303 and moving down in the hierarchy to the last level 307, the netlist is partitioned into an increasing number of P bins. For convenience of explanation, at the first level 303 $P \geq 2$ and is a power of 2 (such as 2, 4, etc.). P then grows exponentially as each level is reached. At each level, each bin may contain a certain number of the circuit components of the netlist. For example, at the first level 303, the netlist is partitioned into 4 bins. At the second level, each bin in the first level is further partitioned into another 4 bins, which means there is a total of 16 bins at the second level. This continues until the last level 307 is reached. Therefore, in the current example, at the h-th level 305 there are $4^h$ bins. The particular partitioning method could be any multilevel method appreciated by those skilled in the art, such as the method described in "Multilevel k-way Hyper-graph Partitioning" by G. Karypis and V. Kumar, published in 2000 by Overseas Publishers Association (OPA) N.V., which is hereby incorporated by reference in its entirety. After partitioning at the h-th level 305, the simulated annealing process described herein may be carried out on the bins.

In simulated annealing processes, there is generally a global parameter T (called the temperature), which is gradually decreased during the process. The simulated annealing process described herein depends on T such that the current solution (i.e., current placement design of the IC) may change relatively widely when T is large, but increasingly "downhill" towards a lower cost placement as T goes to zero. Thus, the pyramid optimization-based simulated annealing process assigns an initial temperature $T_h$ (or iteration number limit L) at level h and after each placement iteration at level h, the temperature is decreased by 1 (i.e., cooled) until it reaches 0. The process then moves on to level h+1 until it reaches the last level 307. As can be seen in FIG. 3, the initial temperature T of the simulated annealing process (which is taken as the iteration limit number L) at the h-th level has a linear relationship with the level number h. That is, the optimization effort has a linear relationship with the optimization level. The larger the number of the optimization level, the higher the optimization effort and thus the placement optimizing effort increases linearly along with the partitioning. The simulated annealing process may be controlled by a pyramid optimization-based simulated annealing process based on such a multilevel top-down placement approach as described above.

Figure 4:
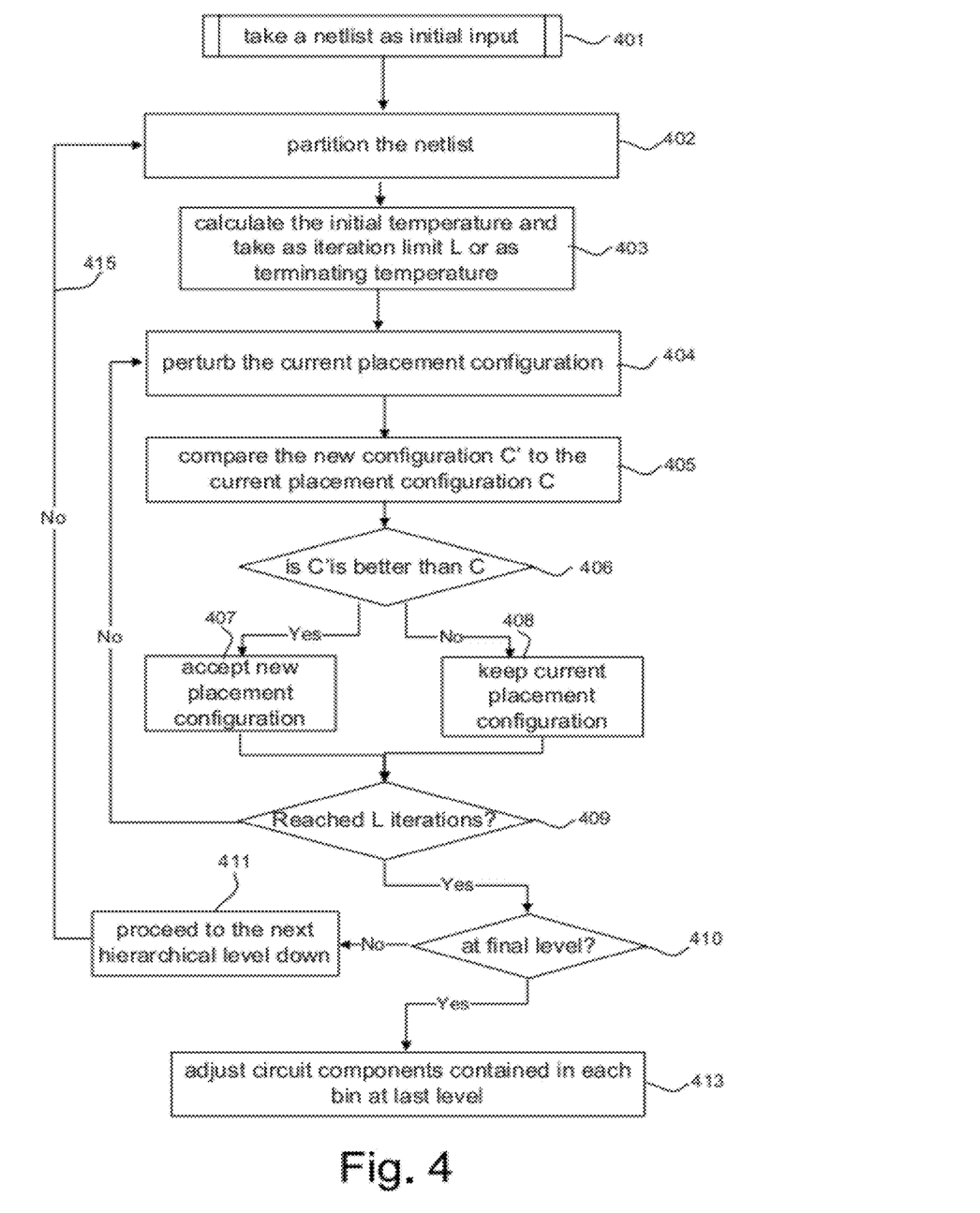
FIG. 4 is a flow chart illustrating an example process for pyramid optimization-based simulated annealing for IC placement.

Referring next to FIG. 4, shown is a flow chart illustrating an example process for pyramid optimization-based simulated annealing for IC placement. The placement flow first takes 401 a netlist describing the IC as original input parameters as described above. The netlist is then partitioned 402 into P number of bins (e.g., $P \geq 2$ and could be power of 2 such as 2, 4, etc., for example) and a current placement configuration C is generated. The initial temperature of the simulated annealing process being performed at a current hierarchical level is calculated 403 according to a pyramid optimization algorithm based on previous partitions of the netlist at previous hierarchical levels, if any, and then the result is taken as the iteration limit L for the current hierarchical level. This means that initially, there may have been no previous partitions made. However, as an iterative process, this operation of partitioning 403 is repeated 415 in future iterations at subsequent hierarchal levels, at which point the pyramid optimization algorithm takes into account the previous partitions at previous hierarchical levels. See the formula (s) used by Initial Temperature (T) Value Generator 500 of FIG. 5 as example formulas that take into account the previous partitions at previous hierarchical levels when calculating the initial temperature. The current placement configuration is then perturbed 404 randomly through a move to generate a new placement configuration. The move may be any one or combination of displacement of a bin to a new position, interchanging bins, changing orientation of a bin, and so forth as appreciated by those skilled in art. The move may also be conducted at the circuit component level. For example, the move may displace one or more circuit components to a new position within a certain radius, as appreciated by those skilled in art.

The new configuration C' is then compared 405 to the current placement configuration C. It is then determined 306 which placement configuration results in less cost for the IC design. The new configuration C' is accepted 407 as the current placement configuration if it has a lower placement cost as compared to the current configuration C, otherwise the new placement is dropped and the current placement remains same and is kept 408 for the next iteration. The method to evaluate cost may be based on any one or combination of the placement cost components such as area, wire length, overlap, timing, power consumption, and congestion as appreciated by those skilled in art. Alternatively, the system may probabilistically accept the new configuration C' even though it has a higher placement cost.

It is then determined 409 whether L iterations of the above process of perturbing the placement configuration have been reached for the current hierarchical level. The process of perturbing 404 and evaluation 405 is iterated L times at the h-th level until the number of iterations calculated according to the pyramid optimization algorithm has been reached. If L iterations have not been reached, the process above repeats starting with perturbing 404 the current placement configuration at the current hierarchical level. If L iterations have been reached, then it is determined 410 whether the current level is the final level (i.e., whether the process is at the final hierarchical level).

As described above, the final level may be determined based upon predetermined stop criteria. For a bin-based simulated annealing process, the predetermined stop criteria may be, for example, when the average number of cells per bin is less than a given number (e.g., 5 to 14). If it is determined that the process is not at the final hierarchical level, then the process proceeds 411 to the next hierarchical level down and repeats the process above starting with partitioning 402 of the netlist at the next hierarchical level into an exponentially increasing number of smaller bins. For example, after the simulated annealing is completed on the h-th level, the placement flow proceeds to the (h+1)-th level. Each bin is further partitioned into 4 bins; thereby producing $4^{h+1}$ number of bins in total at the h+1 level. Thus, the current partition hierarchy level has a value equal to how many times the components have been previously partitioned into bins plus 1. For example, if the current hierarchal level is 3, the components have been previously partitioned 2 times before. If it is determined that the process is at the final hierarchical level, then circuit components contained in each bin may be adjusted 413 at the final level so that said circuit components are not overlapped, whereby the final placement is completed. The final placement of the netlist may then be evaluated by a certain evaluation method as mentioned above to generate an evaluation result.

Figure 5:
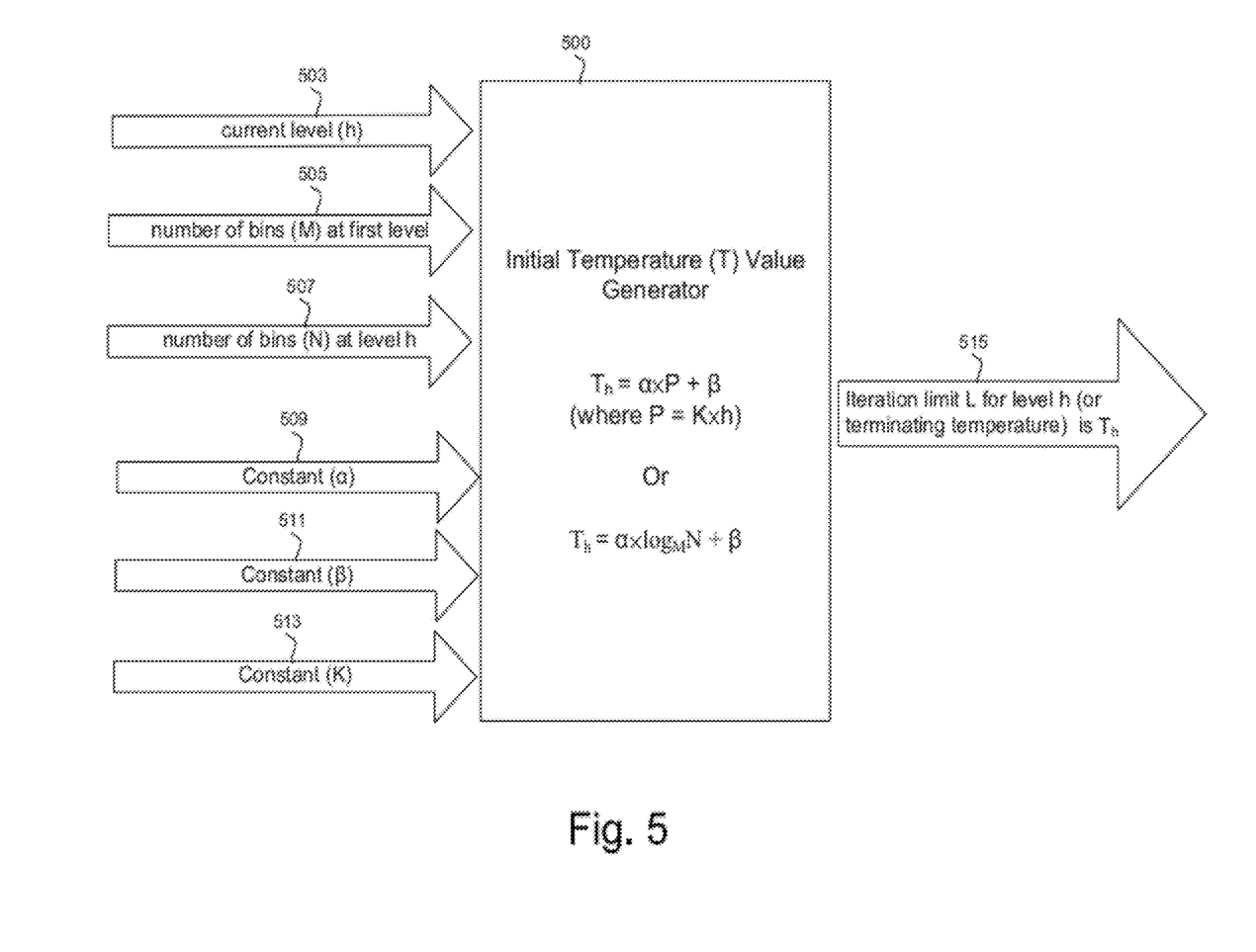
FIG. 5 is a block diagram of an example initial temperature value generator for pyramid optimization-based simulated annealing for IC placement.

Referring next to FIG. 5, shown is a block diagram of an example initial temperature value generator for the pyramid optimization-based simulated annealing process of FIG. 4. As shown at operation 403 of FIG. 4, the initial temperature T is calculated. FIG. 5 shows an example generator to calculate this initial temperature according to one example embodiment of pyramid optimization-based simulated annealing. Shown in FIG. 5 are inputs to the initial temperature value generator 500. The inputs may include the current level (h) 503, the number of bins (M) 505 at the first level, the number of bins (N) 507 at level h, and three constants: α 509, β 511 and K 513. Optimal values for these constants may be obtained through experimentation. However, as an example, α may be about −12 and β may be about 64.

For example, the initial temperature value generator 500 may generate an initial temperature value T for a given level h ($T_h$) by calculating $T_h$ according to the following formula:

$$T_h = \alpha \times P + \beta \text{ (where } P = K \times h\text{)}$$

$T_h$ could either denote the initial temperature of the simulated annealing process at the h-th level which is then taken as the iteration limit number L of the h-th level, or alternatively, $T_h$ could denote the simulated annealing termination temperature 515. Using the above formula at level h=2 and a constant α value of −12, β value of 64, and K value of 1, $T_2$ is equal to 40. Therefore, the number 40 may denote the initial temperature of the simulated annealing process at the second level in the above example which is then taken as the iteration limit number L of the second level.

As a further example, the initial temperature value generator 500 may generate an initial temperature value T for a given level h ($T_h$) by calculating $T_h$ according to the following formula:

$$T_h = \alpha \times \log_M N + \beta$$

Since M denotes the number of bins in the first level and N denotes the total number of bins at h-th level, $\log_M N$ represents the density of the placement at each hierarchical level. For example, if the netlist is partitioned into 4 bins at the first level and each bin is further partitioned into another 4 bins at each level down on the hierarchy, then both M and N are 4 at the first level. N is then 16 at the second level, 64 at the third level and so on. Therefore, $\log_M N$ is 1 at the first level, 2 at the second level, 3 at the third level and so on. Given the above example at level h=2 and a constant α value of −12 and β value of 64, $T_2$ is also equal to 40. Therefore, the number 40 may denote the initial temperature of the simulated annealing process at the second level in the above example which is then taken as the iteration limit number L of the second level.

Figure 6:
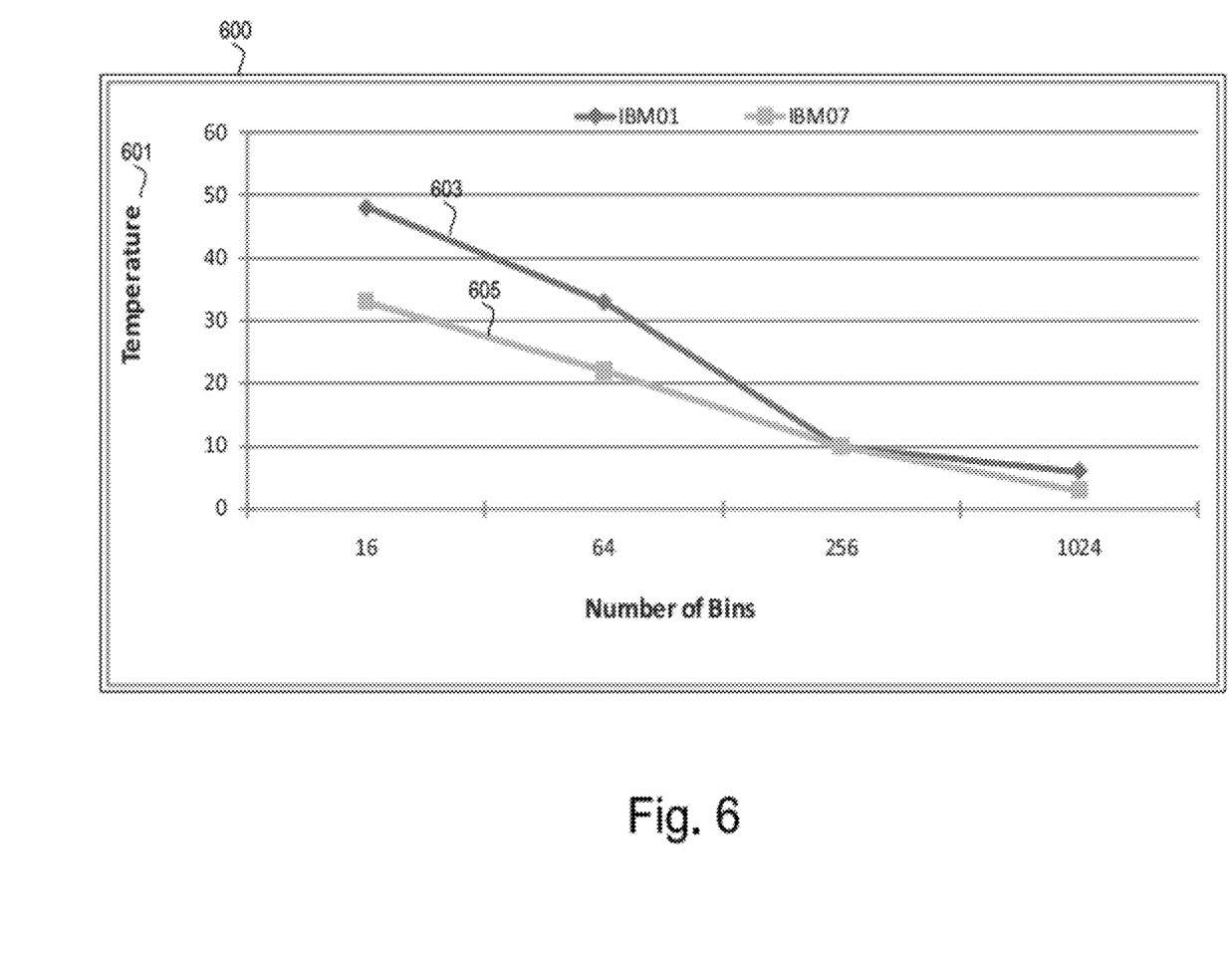
FIG. 6 is a graph showing the relationship between the terminating simulated annealing temperature and the number of bins at different levels using pyramid optimization-based simulated annealing for IC placement.

Referring next to FIG. 6, shown is a graph 600 illustrating the relationship between the terminating simulated annealing temperature and the number of bins at different levels using pyramid optimization-based simulated annealing for IC placement. FIG. 6 shows the terminating temperature at each stage (with 16, 64, 256 and 1024 bins respectively) with an initial temperature being set at 63. The terminating temperature is the point where the iteration stops with the most optimal wire length (for example) at that stage for test circuits ibm01 603 and ibm07 605

Implementation results of the pyramid optimization-based simulated annealing described above were obtained by running a placement tool (i.e., placer) incorporating the method on a Sun® Ultra 10 workstation with a 400 MHz central processing unit (CPU) on various circuits ibm01, ibm07, ibm08, ibm09, ibm10 and ibm11 and using IBM-PLACE benchmarks. The placer read Lenex XML Data file/module-definition (LEF/DEF) files and output placement results in DEF format. The Cadence™ Warp Router is used to read the placement outputs and do the routing. The properties of the benchmarks are summarized in Table I below.

TABLE I

Shown in the table below are circuit statistics, including number of cells, number of nets, number of rows, row utilization, white space ratio and number of routing layers for various circuits ibm01, imb07, ibm08, ibm09, ibm10 and ibm11.

| circuits | cells | nets | rows | white space | Core (row) util. | routing layers |
|---|---|---|---|---|---|---|
| ibm01 | 12,028 | 11,753 | 132 | 14.88% | 85.12% | 4 |
| ibm07 | 44,811 | 44,681 | 233 | 10.05% | 89.95% | 5 |
| ibm08 | 50,672 | 48,230 | 243 | 9.97% | 90.03% | 5 |
| ibm09 | 51,382 | 50,678 | 246 | 9.76% | 90.24% | 5 |
| ibm10 | 66,762 | 64,971 | 321 | 9.78% | 90.22% | 5 |
| ibm11 | 68,046 | 67,422 | 281 | 9.89% | 90.11% | 5 |

The placer can produce better quality circuit placement compared to the placement tool Dragon when the associated simulated annealing algorithm terminates at a special temperature at a higher hierarchical level. For example, if the simulated annealing algorithm terminates at 48° C. instead of a very low temperature at the 1st stage (Dragon terminates the simulated annealing algorithm when the temperature is smaller than 1 at each hierarchical level), the placer can reduce the final placement wire length by 4%.

Figure 7:
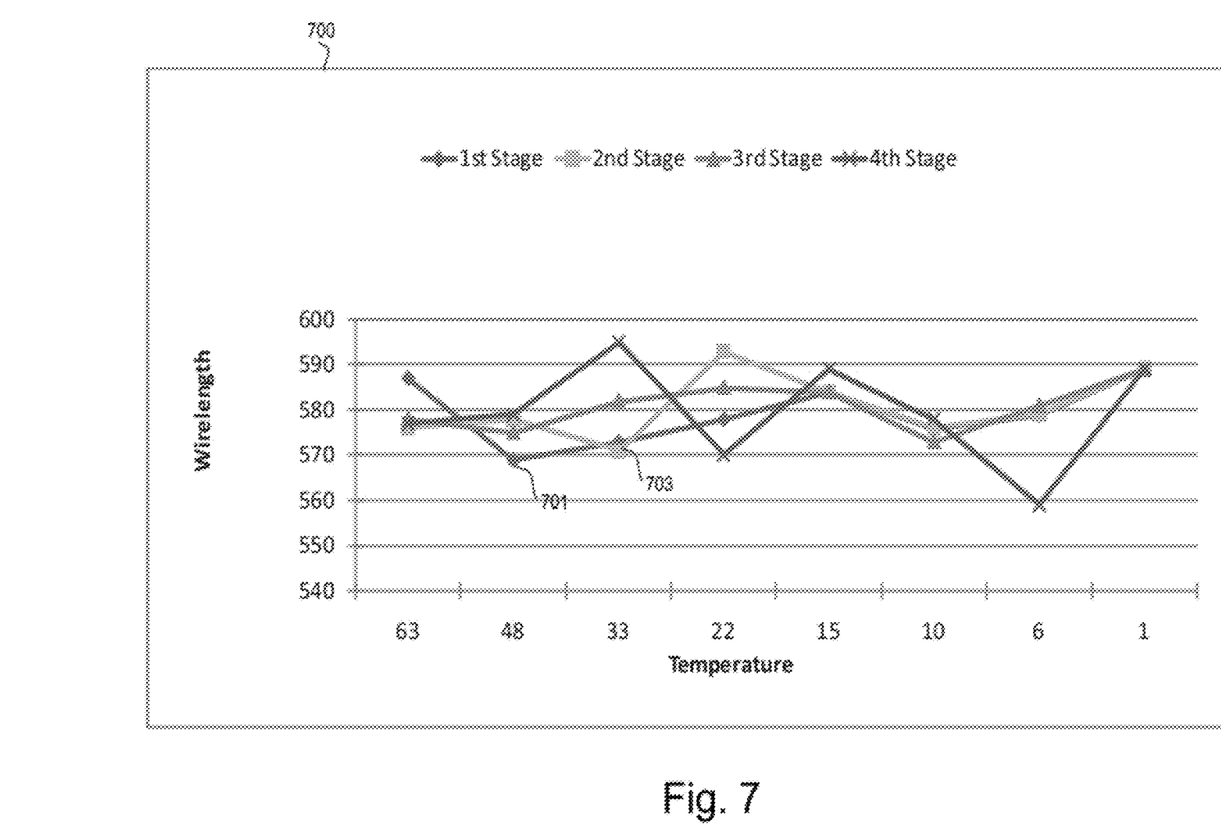
FIG. 7 is a graph showing sample test results of final placement wire length vs. terminating temperature at different hierarchical levels (i.e. stages) using pyramid optimization-based simulated annealing for IC placement on test circuit IBM01.
Figure 8:
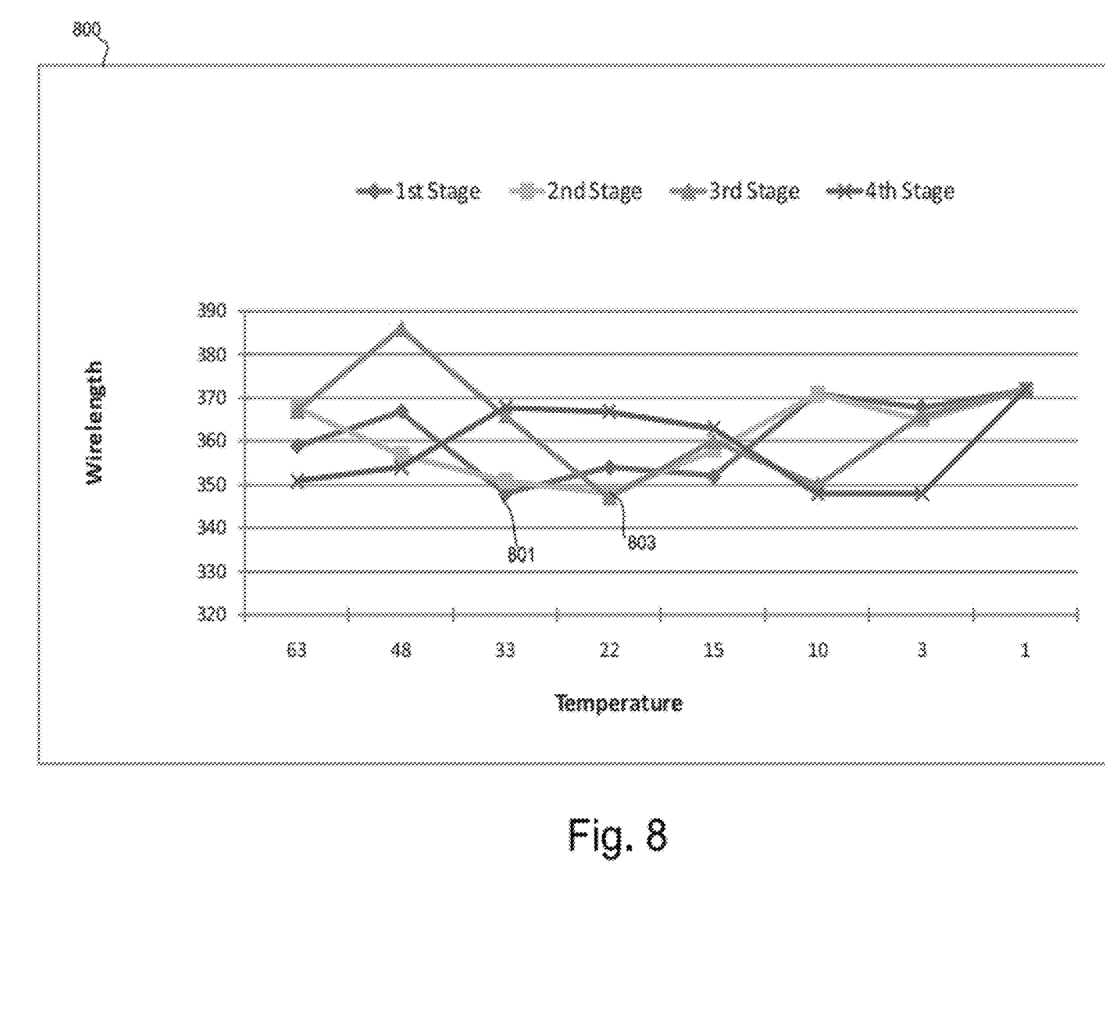
FIG. 8 is a graph showing sample test results of final placement wire length vs. terminating temperature at different hierarchical levels (i.e. stages) using pyramid optimization-based simulated annealing for IC placement on test circuit IBM07.

Referring next to FIGS. 7 and 8, shown are two graphs 700 800 illustrating sample test results of final placement wire length vs. terminating temperature at different hierarchical levels (i.e. stages) for a placer using a pyramid optimization-based simulated annealing on test circuits ibm01 and ibm07, respectively.

Shown in FIGS. 7 and 8 is the optimal termination temperature at respective stages with the initial temperature being 63. For example, at the 1st stage 701 shown in FIG. 7 the optimal terminating temperature with the shortest wire length is 48. That is, the iteration has been carried out for 63−48=15 times. At the 2nd stage 703 shown in FIG. 7 the optimal terminating temperature is 33. That is, the iteration has been carried out for 63−33=30 times, and so on. At the 1st stage 801 shown in FIG. 8 the optimal terminating temperature with the shortest wire length is 33 wherein the iteration has been carried out for 63−33=30 times. At the 2nd stage 803 shown in FIG. 8 the optimal terminating temperature is 22 wherein the iteration has been carried out for 63−22=41 times, and so on. FIGS. 7 and 8 respectively illustrate the above experimental result with different testing netlists for test circuits ibm01 and ibm07 and show that the placer can obtain better quality by terminating the simulated annealing process at different special temperatures for different hierarchical levels instead of terminating at very low temperature at each level.

Figure 9:
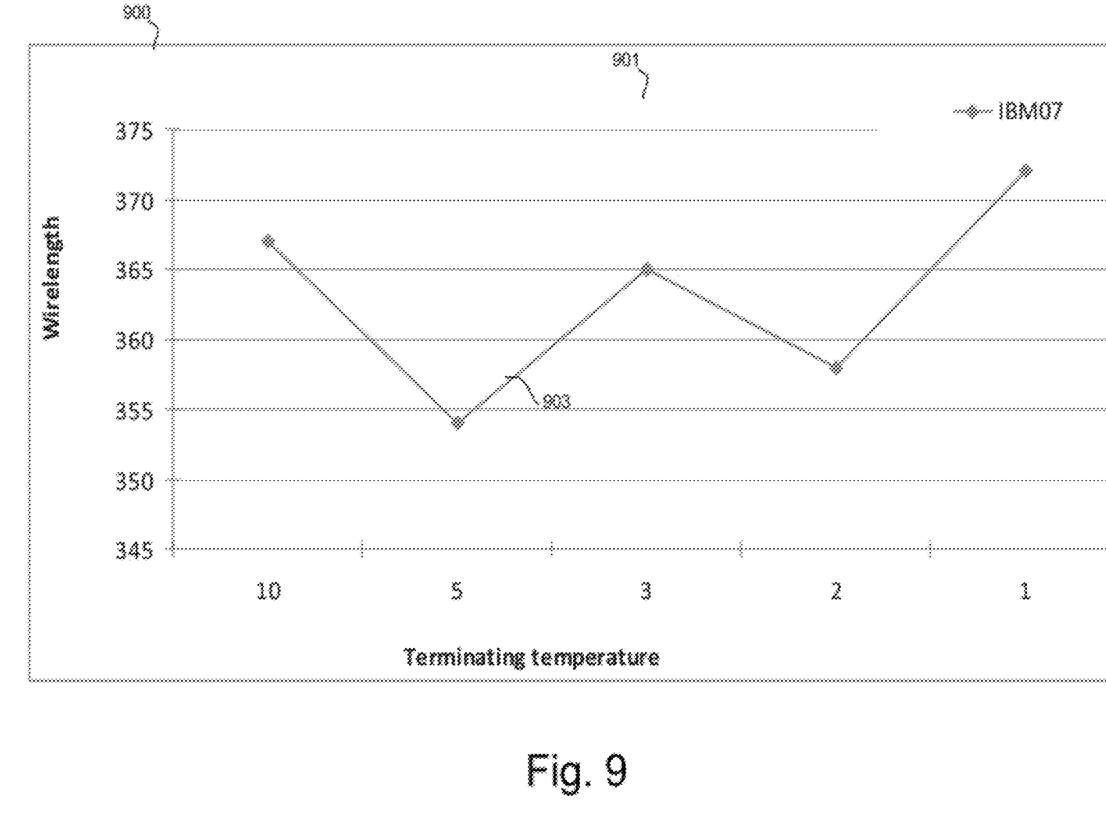
FIG. 9 is a graph showing sample test results of final placement wire length vs. terminating temperature using cell-based pyramid optimization-based simulated annealing for IC placement.

Referring next to FIG. 9, shown is graph illustrating sample test results of final placement wire length vs. terminating temperature using cell-based pyramid optimization-based simulated annealing for IC placement. The graph 900 shows the wire length vs. terminating temperature when the cell-based pyramid optimization algorithm was run on test circuit ibm07 901. A cell-based simulated annealing process is performed after the bin-based placement described above is adjusted into row structures. Cell-based simulated annealing process is very time consuming due to the huge computational complexity. The graph 900 of FIG. 9 demonstrates that there also exists a best terminating temperature 903 in the cell-based simulated annealing process for ibm07 901. In order to reduce the placement runtime, the correlation between the pyramid optimization-based simulated annealing algorithm and the cell simulated annealing cooling schedule was studied.

The placer was also tested for other circuits using IBM-PLACE benchmarks. The experimental results are shown in Table II below. Bounding box wire length and routed wire length are in meters. Runtimes are in minutes. Compared to Dragon, the placer based on the pyramid optimization-based algorithm can produce similar or slightly better layout quality with almost half placement runtime compared to Dragon.

A placement tool based on pyramid optimization-based simulated annealing processes described herein (i.e., the "pyramid optimization-based placer" or "placement tool") may be implemented in the C programming language. The test results below were obtained by running the placement tool on a SUN Ultra10 workstation with a 400 MHz CPU. The Cadence™ Warp Router was used to read placement outputs and do global and final routing. Table II below is the comparison between the placement tool and Dragon. Each placement is run once. Compared to Dragon, the placement tool produced similar or slightly better layout quality with almost the half runtime as Dragon.

TABLE II

Comparison Between the Pyramid Optimization-based Placer and Dragon

| Cir. | Placer | Place- WL | Routing result | vios | WL | Placement Time(m) | Speed up |
|---|---|---|---|---|---|---|---|
| ibm01 | Dragon | 0.58 | Success | 0 | 0.86 | 28 | 2× |
|  | Pyramid Optimization-based Placer | 0.58 | Success | 0 | 0.87 | 14 |  |
| ibm07 | Dragon | 3.72 | Success | 0 | 4.55 | 83 | 1.9× |
|  | Pyramid Optimization-based Placer | 3.69 | Success | 0 | 4.57 | 45 |  |
| ibm08 | Dragon | 3.88 | Success | 0 | 5.1 | 185 | 1.8× |
|  | Pyramid Optimization-based Placer | 3.76 | Success | 0 | 4.8 | 103 |  |
| ibm09 | Dragon | 3.21 | Success | 0 | 3.99 | 151 | 1.8× |
|  | Pyramid Optimization-based Placer | 3.36 | Success | 0 | 3.92 | 83 |  |
| ibm10 | Dragon | 6.00 | Success | 0 | 7.60 | 176 | 2× |
|  | Pyramid Optimization- | 6.28 | Success | 0 | 7.46 | 98 |  |

TABLE II-continued

Comparison Between the Pyramid Optimization-based Placer and Dragon

| Cir. | Placer | Place- WL | Routing | | | Placement Time(m) | Speed up |
|---|---|---|---|---|---|---|---|
| | | | result | vios | WL | | |
| ibm11 | based Placer Dragon | 4.77 | Success | 0 | 5.50 | 166 | 1.8× |
| | Pyramid Optimization-based Placer | 4.92 | Success | 0 | 5.58 | 94 | |

The half-perimeter wire length and routed wire length improvements of the Pyramid optimization-based placer and Dragon over the QPlace placement tool and Capo placement tool (developed by the University of California Los Angeles) are summarized in Table III and Table IV, respectively.

TABLE III

Half-perimeter Wire Length and Routed Wire Length Improvements of the Pyramid Optimization-based Placer and Dragon over QPlace

| | Dragon | | | Pyramid Optimization-based Placer | | |
|---|---|---|---|---|---|---|
| | WL (P) | WL (R) | Total Runtime | WL (P) | WL (R) | Total Runtime |
| ibm01 | 17% | 8% | −23% | 17% | 7% | 22% |
| ibm07 | 2% | 8% | 62% | 3% | 8% | 55% |
| ibm08 | 3% | 4% | 75% | 6% | 9% | 83% |
| ibm09 | 10% | 6% | −229% | 4% | 7% | −83% |
| ibm10 | 7% | 4% | −200% | 3% | 5% | −53% |
| ibm11 | 7% | 11% | −83% | 4% | 10% | −21% |
| Aver. | 8% | 7% | −66% | 6% | 8% | 1% |

*For ibm08, the routing result is considered finished with 2 violations.

As shown in Table III above, though Dragon's total runtime is longer than QPlace, Dragon's results correspond to better quality. On the other hand, the pyramid optimization-based placer also produces placements with better quality for tested circuits. In other words, the pyramid optimization-based placer can produce the better quality while spending a less amount of time. On average, compared to QPlace, the pyramid optimization-based placer produced 8% better layout quality with a slightly shorter total runtime, while Dragon produced a 7% better layout quality with a 66% longer runtime.

TABLE IV

Half-perimeter Wire Length and Routed Wire Length Improvements of the Pyramid Optimization-based Placer and Dragon over Capo

| | Dragon | | | Pyramid Optimization-based Placer (Q = G) | | |
|---|---|---|---|---|---|---|
| | WL (P) | WL (R) | Total runtime | WL (P) | WL (R) | Total runtime |
| ibm01 | 6% | — | — | 6% | — | — |
| ibm07 | 9% | — | — | 9% | — | — |
| ibm08 | 7% | — | — | 10% | — | — |
| ibm09 | 8% | 8% | −105% | 5% | 9% | −7% |
| ibm10 | 10% | 14% | −2% | 8% | 15% | 43% |
| Aver. | 8% | 11% | −54% | 7% | 12% | 25% |

In Table IV The runtimes of the pyramid optimization-based placer, Dragon and Capo are on an Intel/PC with a 733 MHz CPU. Compared to Capo, Dragon and the pyramid optimization-based placer show significantly better ability to produce routable placement. In Table IV, for ibm01, ibm07 and ibm08, Capo fails to produce routable placement (without a routing violation). For rest of the circuits, the pyramid optimization-based placer can reduce the routed wire length by 12% with 25% shorter total runtime.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to disclosures containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed:

1. A simulated annealing method to determine placement of integrated circuit (IC) components within a core area of an IC during physical design of the IC, comprising:
   partitioning a netlist of the IC into a current number of bins representing areas of the IC to generate a current placement configuration at a current partition hierarchy level;
   calculating an iteration limit based on a level number of the current partition hierarchy level, wherein the iteration limit at the current partition hierarchy level has a linear relationship with the level number of the current partition hierarchy level;
   perturbing the current placement configuration to generate a new placement configuration;
   determining whether to accept the new placement configuration as the current placement configuration based on costs associated with the current placement configuration and the new placement configuration; and
   prior to partitioning further the netlist into a new number of bins at a next partition hierarchy level, determining whether a number of repeating the perturbing the current placement configuration and the determining whether to accept the new placement configuration has reached the iteration limit at the current partition hierarchy level, wherein the new number of bins is greater than the current number of bins.

2. The method of claim 1, further comprising:
partitioning further the netlist into a larger total number of smaller bins compared to at least one of the current number of bins and the new number of bins until a number of circuit components in each bin is below a specified number.

3. The method of claim 2, wherein the calculating the iteration limit comprises generating an initial temperature value (T) according to a formula: $T=\alpha*P+\beta$, where $P=K*h$ and h is the level number of the current partition hierarchy level and is associated with a number of times the netlist has been partitioned into bins, and $\alpha$, $\beta$ and K are constant values.

4. The method of claim 2, wherein the calculating the iteration limit comprises generating an initial temperature value (T) according to a formula: $T=\alpha*\log_m N+\beta$, where N is a number of bins after partitioning at the current partition hierarchy level, and M is a number of bins after partitioning at a first partition hierarchy level, wherein any partition hierarchy level has a level number associated with a number of times the netlist has been partitioned into bins, and $\alpha$ and $\beta$ are constant values.

5. The method of claim 4, wherein the constant value $\alpha$ is −12 and the constant value $\beta$ is 64.

6. The method of claim 2, wherein the specified number is from 5 to 14.

7. The method of claim 1, wherein the perturbing the current placement configuration comprises one or more of the following: displacing a bin to a new position, interchanging bins, changing orientation of a bin, or displacing one or more circuit components to a new position.

8. A simulated annealing system to determine placement of integrated circuit (IC) components within a core area of an IC during physical design of the IC, comprising:
a computer processor; and
at least one memory unit operably coupled to the computer processor, the at least one memory unit including computer executable instructions stored thereon that are executable by the computer processor to:
generate an initial temperature value for a current partition hierarchy level out of a plurality of partition hierarchy levels in a simulated annealing process, wherein the initial temperature value at the current partition hierarchy level has a linear relationship with a level number of the current partition hierarchy level;
assign an iteration limit value equal to the initial temperature value;
perform the simulated annealing process on a current partitioning of a netlist of the IC into bins until a number of iterations has reached the iteration limit value for the current partition hierarchy level;
partition further the netlist into an exponentially larger total number of smaller bins at a next partition hierarchy level out of the plurality of partition hierarchy levels compared to a previous number of bins; and
repeat the generate, assign, perform, and partition further, starting with generation of the initial temperature value for the simulated annealing process until a number of circuit components in each bin is below a specified number.

9. The system of claim 8, wherein the instructions to generate the initial temperature value comprise instructions to generate an initial temperature value (T) according to a formula: $T=\alpha*P+\beta$, where $P=K*h$ and h is the level number of the current partition hierarchy level and is associated with a number of times the netlist has been partitioned into bins, and $\alpha$, $\beta$ and K are constant values.

10. The system of claim 8, wherein the instructions to generate the initial temperature value comprise instructions to generate an initial temperature value (T) according to a formula: $T=\alpha*\log_m N+\beta$, where N is a number of bins after partitioning at the current partition hierarchy level, and M is a number of bins after partitioning at a first partition hierarchy level, wherein any partition hierarchy level has a level number associated with a number of times the netlist has been partitioned into bins, and $\alpha$ and $\beta$ are constant values.

11. The system of claim 10, wherein the constant value $\alpha$ is −12 and the constant value $\beta$ is 64.

12. The system of claim 8, wherein the specified number is from 5 to 14.

13. The system of claim 8, wherein the instructions to perform the simulated annealing process on a current partitioning of the netlist into bins comprises instructions to determine to accept a new placement configuration of components of the netlist as a current placement if the new placement configuration results in a lower evaluated placement cost of the IC.

14. A non-transitory computer readable medium including computer executable instructions thereon to perform simulated annealing to determine placement of integrated circuit (IC) components within a core area of an IC during physical design of the IC, said computer executable instructions comprising instructions to:
generate an initial temperature value for a current partition hierarchy level out of a plurality of partition hierarchy levels in a simulated annealing process, wherein the initial temperature value at the current partition hierarchy level has a linear relationship with a level number of the current partition hierarchy level;
assign an iteration limit value equal to the initial temperature value;
perform the simulated annealing process on a current partitioning of a netlist of the IC into bins until a number of iterations has reached the iteration limit value for the current partition hierarchy level the iteration limit value;
partition further the netlist into an exponentially larger total number of smaller bins at a next partition hierarchy level out of the plurality of partition hierarchy levels compared to a previous number of bins; and
repeat the generate, assign, perform, and partition further, starting with generation of the initial temperature value for the simulated annealing process until a number of circuit components in each bin is below a specified number.

15. The non-transitory computer readable medium of claim 14, wherein the instructions to generate the initial temperature value comprise instructions to generate an initial temperature value (T) according to a formula: $T=\alpha*P+\beta$, where $P=K*h$ and h is the level number of the current partition hierarchy level and is associated with a number of times the netlist has been partitioned into bins, and $\alpha$, $\beta$ and K are constant values.

16. The non-transitory computer readable medium of claim 14, wherein the instructions to generate the initial temperature value comprise instructions to generate an initial temperature value (T) according to a formula: $T=\alpha*\log_m N+\beta$, where N is a number of bins after partitioning at the current partition hierarchy level, and M is a number of bins after partitioning at a first partition hierarchy level, wherein any partition hierarchy level has a level number associated with a number of times the netlist has been partitioned into bins, and $\alpha$ and $\beta$ are constant values.

* * * * *

UNITED STATES PATENT AND TRADEMARK OFFICE
CERTIFICATE OF CORRECTION

PATENT NO. : 8,762,121 B2  Page 1 of 1
APPLICATION NO. : 13/256635
DATED : June 24, 2014
INVENTOR(S) : Xu It is certified that error appears in the above-identified patent and that said Letters Patent is hereby corrected as shown below:

On the Title Page, Item (73), under "ASSIGNEE", in Column 1, Line 2, delete "Centre (CN)" and insert -- Centre, Shenyang (CN) --, therefor.

In the Specification

In Column 2, Line 45, delete "FIG. 1 a" and insert -- FIG. 1 is a --, therefor.

In Column 8, Line 62, delete "605" and insert -- 605. --, therefor.

In Column 9, in Table 1, Line 4, delete "imb07," and insert -- ibm07, --, therefor.

In the Claims

In Column 15, Line 15, in Claim 4, delete "$T=\alpha*\log_m N+\beta$," and insert -- $T=\alpha*\log_M N+\beta$, --, therefor.

In Column 16, Line 4, in Claim 10, delete "$T=\alpha*\log_m N+\beta$," and insert -- $T=\alpha*\log_M N+\beta$, --, therefor.

In Column 16, Line 59, in Claim 16, delete "$T=\alpha*\log_m N+\beta$," and insert -- $T=\alpha*\log_M N+\beta$, --, therefor.

Signed and Sealed this
Twenty-first Day of October, 2014

Michelle K. Lee
*Deputy Director of the United States Patent and Trademark Office*